United States Patent
Tsubaki et al.

(10) Patent No.: US 11,608,229 B2
(45) Date of Patent: Mar. 21, 2023

(54) STORAGE SYSTEM AND PURGE METHOD IN STORAGE SYSTEM

(71) Applicant: MURATA MACHINERY, LTD., Kyoto (JP)

(72) Inventors: Tatsuo Tsubaki, Ise (JP); Takashi Yamaji, Ise (JP)

(73) Assignee: MURATA MACHINERY, LTD., Kyoto (JP)

(*) Notice: Subject to any disclaimer, the term of this patent is extended or adjusted under 35 U.S.C. 154(b) by 253 days.

(21) Appl. No.: 16/642,084

(22) PCT Filed: Jul. 19, 2018

(86) PCT No.: PCT/JP2018/027043
§ 371 (c)(1),
(2) Date: Feb. 26, 2020

(87) PCT Pub. No.: WO2019/049518
PCT Pub. Date: Mar. 14, 2019

(65) Prior Publication Data
US 2020/0180864 A1    Jun. 11, 2020

(30) Foreign Application Priority Data
Sep. 8, 2017    (JP) .............................. JP2017-172888

(51) Int. Cl.
*H01L 21/673* (2006.01)
*B65G 1/137* (2006.01)
*H01L 21/677* (2006.01)

(52) U.S. Cl.
CPC .......... *B65G 1/137* (2013.01); *H01L 21/6773* (2013.01); *H01L 21/67393* (2013.01); *H01L 21/67733* (2013.01); *H01L 21/67769* (2013.01)

(58) Field of Classification Search
CPC ......... H01L 21/67373; H01L 21/67389; H01L 21/673; H01L 21/677; H01L 21/67706;
(Continued)

(56) References Cited

U.S. PATENT DOCUMENTS 8,240,346 B2    8/2012    Goto et al.
9,245,781 B2    1/2016    Takahara et al.
(Continued)

FOREIGN PATENT DOCUMENTS

JP    2016-218603 A    12/2016
KR    10-2013-0032252 A    4/2013
(Continued)

OTHER PUBLICATIONS

Official Communication issued in corresponding European Patent Application No. 18854967.9, dated Apr. 30, 2021.
(Continued)

*Primary Examiner* — Jarrett J Stark
(74) *Attorney, Agent, or Firm* — Keating & Bennett, LLP

(57) ABSTRACT

A storage system includes shelves each with a nozzle to supply clean gas into containers, flow amount controllers to control a supply amount of clean gas to a nozzle, a transport apparatus to transfer the containers to and from the shelves, and a controller to control the transport apparatus and the flow amount controllers. The controller makes an assignment of at least one shelf in preparation to store an incoming container and before the occurrence of the incoming container, and controls a flow amount controlling device to supply clean gas to the nozzle in the at least one shelf, based upon the assignment.

8 Claims, 7 Drawing Sheets

(58) Field of Classification Search
CPC ........... H01L 21/67393; H01L 21/6773; H01L 21/67733; H01L 21/67769; B65G 1/02; B65G 2201/0297; B65G 1/00; B65G 1/0421; B65G 1/137
See application file for complete search history.

(56) References Cited

U.S. PATENT DOCUMENTS

| | | | |
|---|---|---|---|
| 9,524,893 B2 | 12/2016 | Takahara et al. | |
| 2004/0182472 A1* | 9/2004 | Aggarwal | H01L 21/67393 141/98 |
| 2006/0088406 A1* | 4/2006 | Miyajima | H01L 21/67772 414/217 |
| 2006/0272169 A1* | 12/2006 | Miyajima | H01L 21/67772 414/217 |
| 2010/0135753 A1* | 6/2010 | Natsume | H01L 21/67772 414/217.1 |
| 2012/0083918 A1* | 4/2012 | Yamazaki | H01L 21/67389 700/112 |
| 2012/0309286 A1* | 12/2012 | Nakano | H01L 21/67775 454/305 |
| 2013/0121851 A1* | 5/2013 | Kim | H01L 21/67393 417/65 |
| 2014/0017040 A1* | 1/2014 | Takahara | H01L 21/67769 414/222.01 |
| 2016/0358799 A1 | 12/2016 | Murata et al. | |
| 2018/0247846 A1 | 8/2018 | Murata et al. | |

FOREIGN PATENT DOCUMENTS

| | | |
|---|---|---|
| TW | 491802 B | 6/2002 |
| WO | 2017/033546 A1 | 3/2017 |

OTHER PUBLICATIONS

Official Communication issued in corresponding European Patent Application No. 18854967.9, dated Nov. 2, 2022.

* cited by examiner

STORAGE SYSTEM AND PURGE METHOD IN STORAGE SYSTEM

BACKGROUND OF THE INVENTION

1. Field of the Invention

The present invention relates to a storage system, such as a purge stocker, and a purge method in the storage system.

2. Description of the Related Art

Purge stockers have shelves and nozzles provided in the shelves. The nozzles are configured to contact with valves in the bottoms of containers, such as FOUPs, stored on the shelves, and are configured to supply clean gas, such as nitrogen gas or clean dry air, into the containers.

The present applicant discovered that contamination of nozzles in the shelves may cause the contamination of articles, such as semiconductor wafers, in the containers and has proposed to carry out cleaning of the nozzles (to blow away particles on the nozzles) by supplying a small amount of clean gas to the nozzles in empty shelves without the containers (JP4692584B). In addition, JP5557061B has proposed to carry out cleaning just the nozzle of a shelf assigned for an unloading position of a container when a transport apparatus in the purge stocker started to move to the assigned shelf. This purge stocker has a reduced consumption amount of clean gas, since the cleaning is carried out just in the shelf assigned for the unloading position and since the purge is triggered by the start of movement of the transport apparatus.

Regarding commencement of the nozzle cleaning when the transport apparatus has started to move, the present inventors have discovered cases where a container was connected with a not fully cleaned nozzle, because the transport apparatus had arrived at the shelf assigned for the unloading position before the completion of cleaning, and cases where the transport apparatus had to wait for the completion of the cleaning before the transfer of a container with the shelf.

SUMMARY OF THE INVENTION

Preferred embodiments of the present invention provide storage systems and purge methods used in the storage systems, each of which is capable of fully cleaning nozzles before transferring containers to and on the corresponding shelves, with a reduced amount of clean gas consumption, and without phenomena such as delaying the transfer by the transport apparatus for waiting for the completion of the nozzle cleaning.

A storage system according to a preferred embodiment of the present invention includes a plurality of shelves each including at least one nozzle to supply clean gas into containers, a plurality of flow amount controllers to control a supply amount of the clean gas to the at least one nozzle, at least one transport apparatus to transfer the containers to and from the shelves, and a controller to control the at least one transport apparatus and the flow amount controllers.

According to a preferred embodiment of the present invention, the controller is configured or programmed to make an assignment of at least one shelf in preparation to store an incoming container and before the occurrence of the incoming container, and to control one of the flow amount controllers to supply the clean gas to the at least one nozzle in the at least one shelf, based upon the assignment.

A purge method according to a preferred embodiment of the present invention uses a storage system including a plurality of shelves each including at least one nozzle to supply clean gas into containers, a plurality of flow amount controllers to control a supply amount of the clean gas to the at least one nozzle, at least one transport apparatus to transfer the containers to and from the shelves, and a controller to control the at least one transport apparatus and the flow amount controllers.

A method according to a preferred embodiment of the present invention includes making an assignment of at least one shelf in preparation to store an incoming container and before the occurrence of the incoming container, by the controller, and supplying the clean gas to the at least one nozzle in the at least one shelf, based upon the assignment.

According to a preferred embodiment of the present invention, before the occurrence of the incoming container, in other words, before the incoming container arrives at the present purge system, the at least one shelf is assigned to store the incoming container and the cleaning of the nozzle in the assigned shelf is started. Therefore, when the incoming container will arrive at the shelf, the nozzle will be fully cleaned. In addition, an enough time duration is present for the nozzle cleaning, and therefore, there arises no delay of transfer motion by the transport apparatus to unload the incoming container to the shelf, due to waiting for the completion of the nozzle cleaning.

Preferably, the storage system is a purge stocker and is further provided with an entrance and dispatch port, the at least one transport apparatus transports the incoming container between the entrance and dispatch port and the shelves, and the controller is further configured or programmed to make the assignment of the at least one shelf in advance, before the incoming container will arrive at the entrance and dispatch port. In this case, the assignment of the shelf, and the nozzle cleaning are commenced before the incoming container will arrive, and therefore, the nozzle is fully cleaned before the incoming container will arrive at the shelf.

Preferably, the controller is further configured or programmed to control the one of the flow amount controllers to intermittently supply the clean gas to the at least one nozzle in the at least one shelf. In this configuration, even if the incoming container is not unloaded on the assigned shelf for a long time, the nozzle is kept clean with a small consumption amount of clean gas. Namely, even if the incoming container is not unloaded for a long time, the nozzle is kept cleaner than a case where no clean gas is supplied at all. In addition, the consumption amount of clean gas is smaller than a case where the clean gas is supplied continuously.

Particularly preferably, the at least one transport apparatus is provided with a transfer device entering into and unloading the incoming container on the shelves, and the controller is further configured or programmed to control the one of the flow amount controllers to supply a larger flow amount of the clean gas to the at least one nozzle, from when the transfer device starts advancement towards the at least one shelf and until completing unloading of the incoming container, than an amount before the transfer device starts advancement. Then, not only the nozzle but also the bottom (abutting the nozzle) of the incoming container held by the transfer device are made clean.

The above and other elements, features, steps, characteristics and advantages of the present invention will become

DETAILED DESCRIPTION OF THE PREFERRED EMBODIMENTS

Preferred embodiments and modifications thereof for carrying out the present invention will be described. The scope of the present invention shall be construed based upon the claims with reference to the description and well-known art in the field, as the ordinary persons in the field understand.

FIGS. 1-8 indicate a purge stocker 2 according to a preferred embodiment of the present invention. The purge stocker 2 is provided within a clean room and so on, and stores containers for semiconductor wafers, reticles, and so on. The purge stocker 2 is shut off from outside atmosphere by a wall 4, and the wall 4 is provided with a door 5.

Figure 1:
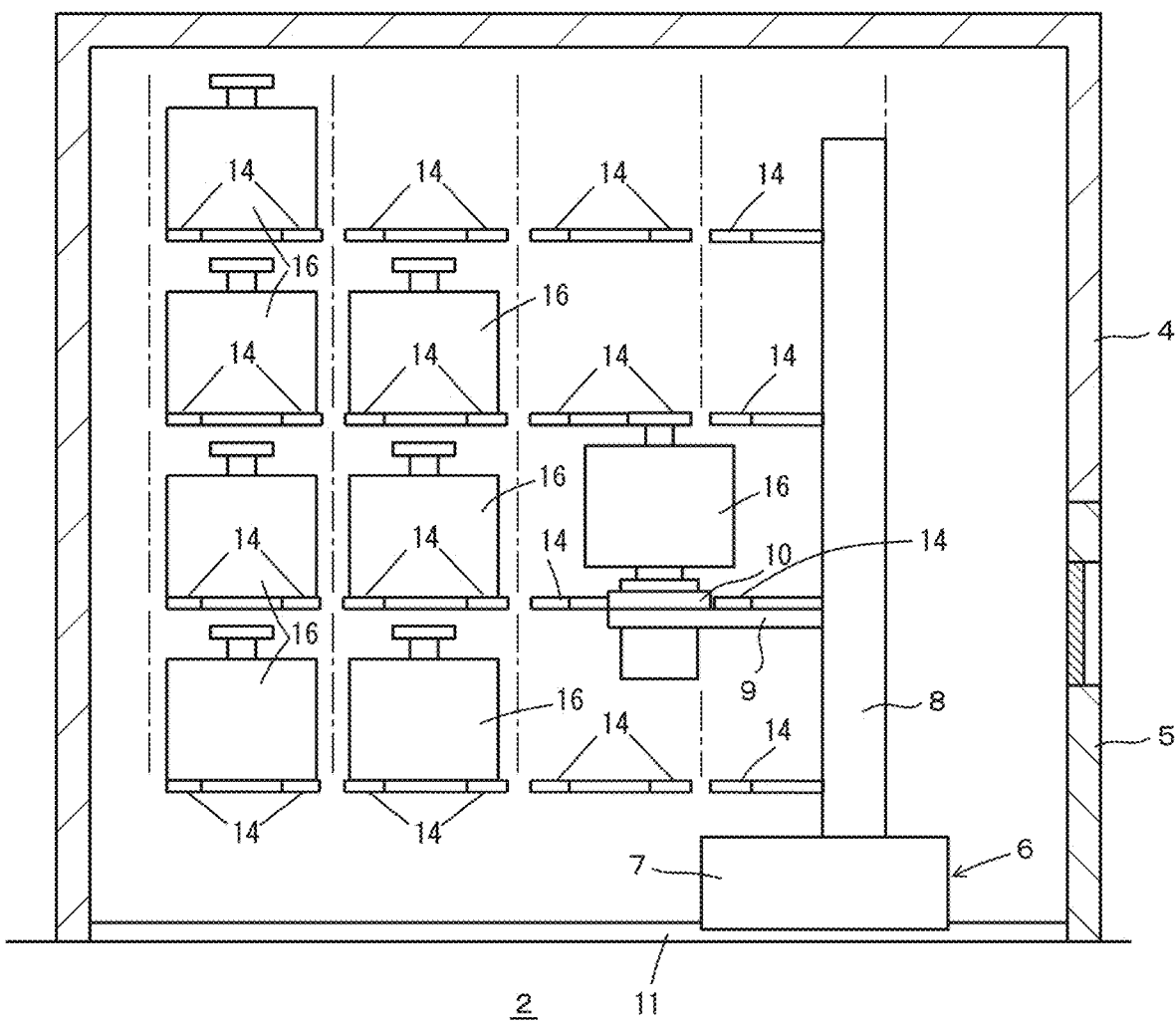
FIG. 1 is a vertical cross-sectional view of a purge stocker (storage system) according to a preferred embodiment of the present invention.

As shown in FIG. 1, the purge stocker 2 is provided with a transport apparatus 6 and a plurality of shelves 14, the transport apparatus 6 is, for example, a stacker crane, but the species of the transport apparatus 6 is arbitrary. The transport apparatus 6 includes a running vehicle 7 that runs on a rail 11 and supports a mast 8, and a carriage 9 elevates and lowers along the mast 8. The carriage 9 in the transport apparatus 6 is provided with a transfer device 10, such as a SCARA arm, a sliding fork, and so on, to transfer a container 16 between a shelf 14. In the specification, plural shelves 14 aligned along a vertical direction are called a column, and plural shelves 14 aligned horizontally with the same height are called a row.

The container 16 according to the present preferred embodiment is a FOUP which stores semiconductor wafers and is provided with a valve in the bottom portion that receives clean gas from a nozzle in the shelf 14, and thus, the inside of the container is kept clean. The species of the container 16 is arbitrary, as long as the container 16 is able to be purged by clean gas blown into from a nozzle of a shelf 14.

Figure 2:
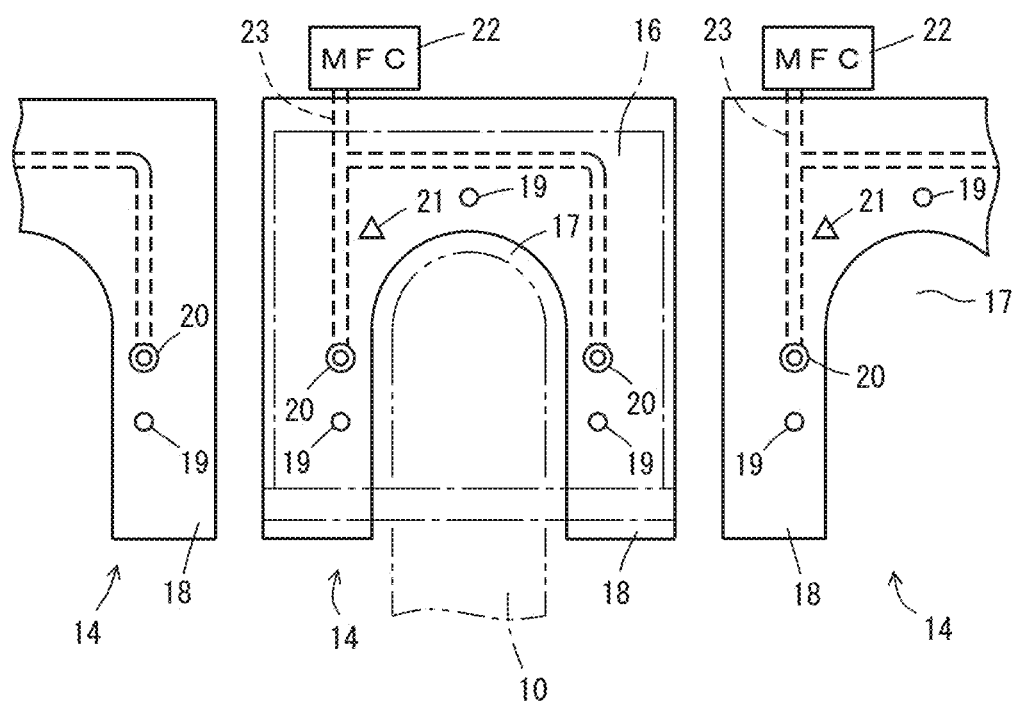
FIG. 2 is a plan view of the shelves of the purge stocker.

FIG. 2 indicates the shelves 14. The shelf 14 is provided with a shelf support 18 including an opening 17, the transport apparatus 10 enters the arm, fork, or the like, into the opening 17 and transfers a FOUP 16 between the shelf 14. Each of the shelves 14 includes three pins 19 coupled with grooves in the bottom of FOUP 16 to position the FOUP 16. Around the opening 17, a pair of or one purge nozzle 20 is provided and the purge nozzle 20 supplies clean gas such as nitrogen or clean dry air into a FOUP 16 supported on the shelf support 18. The shelf support 18 is further provided with a load sensor 21 that detects whether a FOUP 16 is present or absent on the corresponding shelf 14. An MFC 22 (mass flow controller, an example of flow amount controller) supplies clean gas through a pipe 23 to the purge nozzle 20 (hereinafter, may be simply referred to as "nozzle 20" or "nozzle"). The shelf 14 may be provided with an exhaust nozzle to evacuate the atmosphere in a FOUP 16, and so on in addition to the purge nozzle 20.

According to the present preferred embodiment, an MFC 22 is provided for each shelf 14 so that the flow amount of clean gas from a nozzle 20 is controlled for each shelf 14. However, a common MFC 22 for a column or a row may be provided so that the total flow amount of clean gas for the column or the row is controlled.

Figure 3:
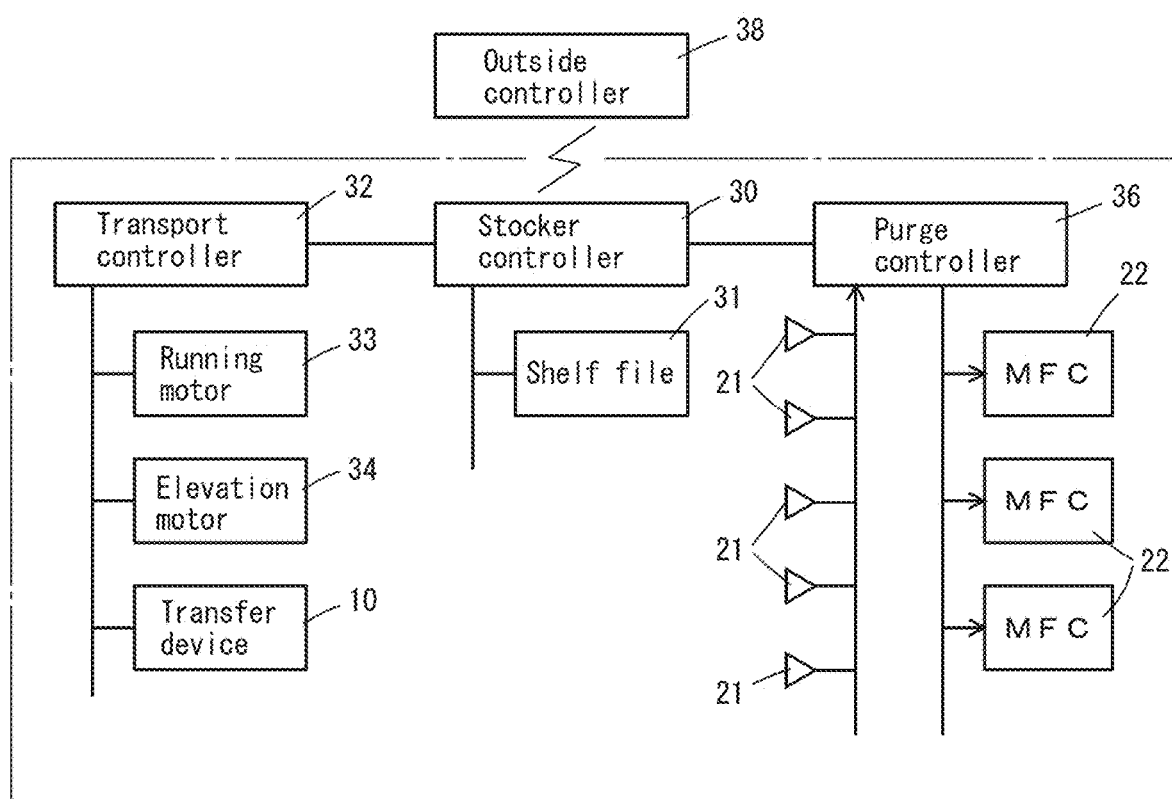
FIG. 3 is a block diagram of a control system of the purge stocker according to a preferred embodiment of the present invention.

FIG. 3 indicates the control system for the purge stocker 2. A stocker controller 30 is the top-level controller in the purge stocker 2 and communicates with a transport controller 32 that controls the transport apparatus 6, in particular, the running motor 33, the elevation motor 34, and the transfer device 10, and also with a purge controller 36 that controls the MFCs 22. The stocker controller 30 also communicates with an outside controller 38 and so on, and assigns a shelf 14 for an unloading position for an incoming FOUP 16, when informed that the incoming FOUP 16 shall be entered in. Further, when the incoming FOUP 16 arrives at an entrance and dispatch port, not shown in the drawings, the stocker controller 30 instructs the transport controller 32 to unload the incoming FOUP 16 on the shelf 14 designated as the unloading position. In addition, the stocker controller 30 determines a shelf 14 as the next unloading position, in advance and in preparation for the occurrence of a next incoming FOUP 16 to be entered, when the above unloading job of the incoming FOUP 16 is completed. Namely, the stocker controller 30 assigns in advance one shelf 14 for the next unloading position, in preparation for the storage of the next incoming FOUP 16. On the other hand, when instructed by the outside controller 38 or the like, to dispatch a FOUP 16, the stocker controller 30 designates, to the transport controller 32, the shelf 14 where the FOUP 16 to be dispatched is stored and instructs it to load the FOUP 16 at the designated shelf 14 and to transport to the entrance and dispatch port. A port for both entrance and dispatch may be provided, or an entrance port and a separate dispatch port may be provided.

The stocker controller 30 includes a memory that stores a file such as a shelf file 31; the memory stores the status of each shelf 14 including: "empty", "empty but assigned for an incoming or next incoming container", "storing a container", "storing a container assigned to dispatch", etc.

Physically one controller may form all of the controllers 30, 32, and 36, or each of the controllers 30, 32, and 36 may comprise plural computers.

The purge controller 36 controls the MFC 22 to carry out storage purge (purge to maintain the cleanliness in a FOUP 16) when it detects that a FOUP 16 was unloaded on a shelf 14, by a signal from a load sensor 21. Further, when the purge controller 36 is informed by the stocker controller 30 that a shelf 14 is assigned for a next incoming FOUP 16, before the actual occurrence of the next incoming FOUP 16 (immediately after the completion of a preceding entrance job), in preparation for the entrance job of the next incoming FOUP 16, the purge controller 36 carries out nozzle purge (purge to clean a nozzle 20) in the assigned shelf 14 so that the nozzle 20 in the assigned shelf 14 is cleaned. In addition, when the purge controller 36 is informed, through the transport controller 32 and the stocker controller 30, that the arm, the fork, or the like of the transfer device 10 is advancing towards the shelf 14 for unloading, or the similar event, the purge controller 36 carries out bottom purge (purge to clean the bottom portion of a FOUP 16 facing a nozzle 20) to clean the bottom portion (inlet portion of clean gas in the bottom) of the incoming FOUP 16. The bottom purge may be omitted.

The purge controller 36 may carry out the storage purge according to an information, via the stocker controller 30 from the transport controller 32, that the entrance job of the incoming FOUP 16 to the shelf 14 has been completed, rather than carrying out the storage purge according to the signal from the load sensor 21.

Figure 4:
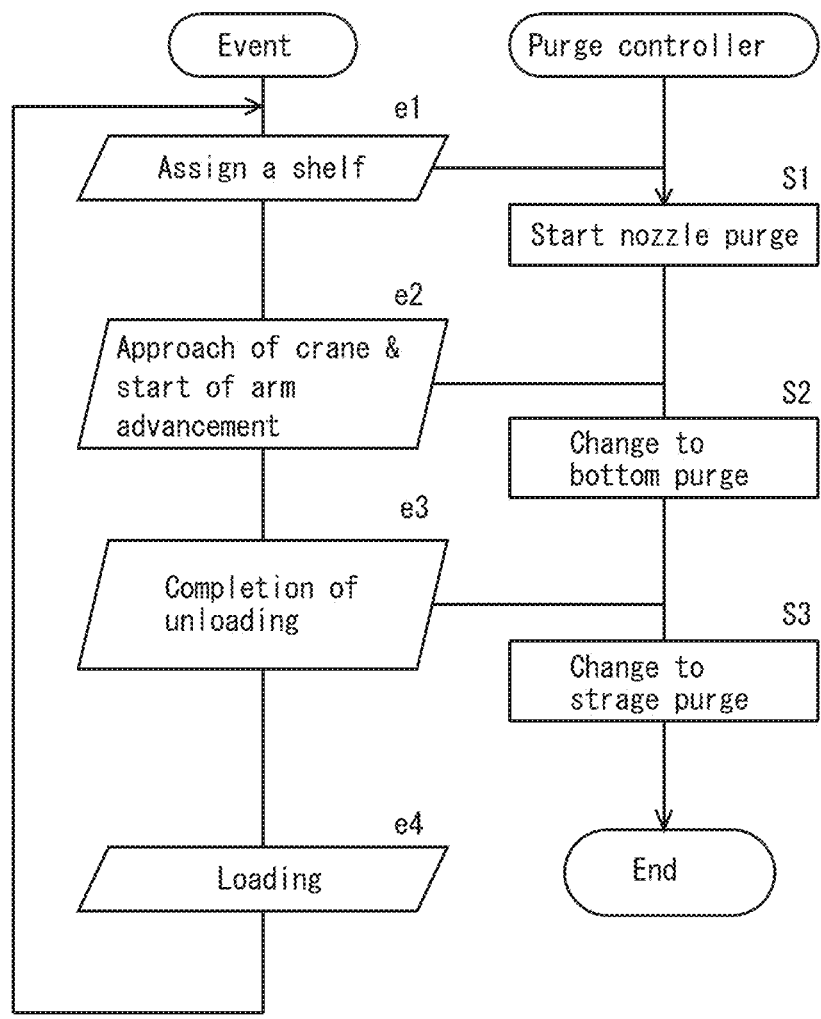
FIG. 4 is a flowchart of a purge algorithm according to a preferred embodiment of the present invention.

FIG. 4 indicates the purge algorithm for a FOUP 16 according to the present preferred embodiment. When one shelf 14 is assigned for a next incoming FOUP 16 (e1), the purge controller starts the nozzle purge for the assigned shelf 14 (S1). Subsequently, when the transport apparatus 6 comes near to the shelf 14 and further when the arm, the fork, or the like of the transfer device 10 starts to advance towards the shelf 14 (e2), the purge controller 36 changes the nozzle purge to the bottom purge (S2). However, the bottom purge may be omitted. Alternatively, when the arm, fork, or the like starts lowering (unloading), the purge controller 36 may start the bottom purge. Then, when the purge controller 36 recognizes that the FOUP 16 has been unloaded on the shelf 14, by a signal from the load sensor 21, the transport controller 32, etc. (e3), the purge controller 36 carries out the storage purge (S3). In addition, when a FOUP 16 is loaded from a shelf 14 (e4), the status of the shelf 14 returns to the empty status, and no further purge is necessary until it will be assigned for a next incoming FOUP.

Figure 5:
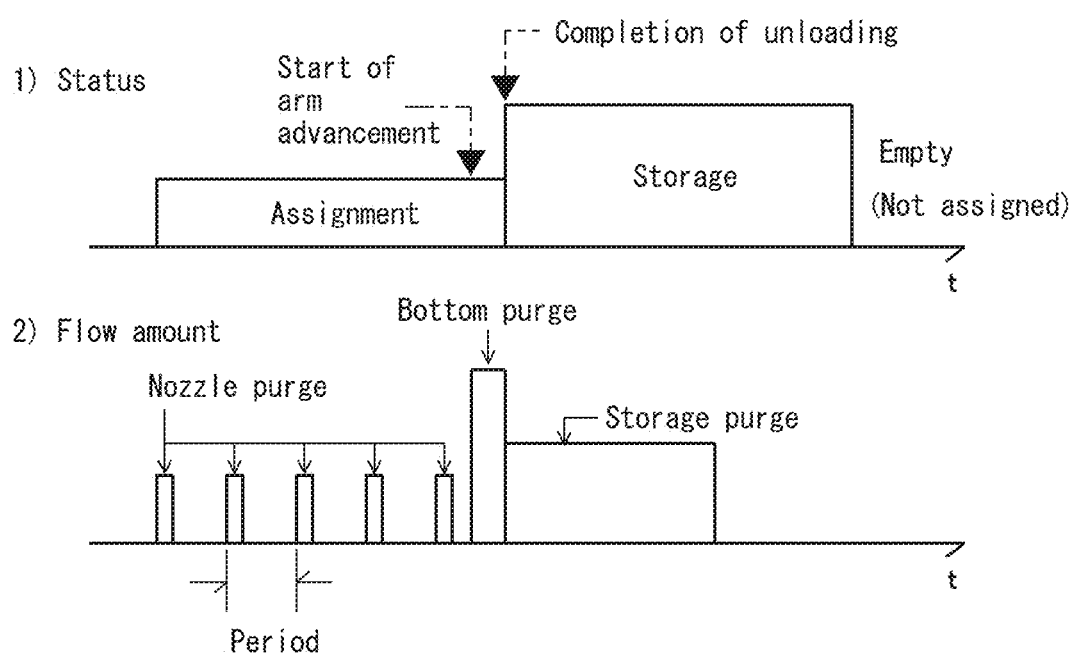
FIG. 5 is a diagram where 1) indicates the status of a shelf and 2) indicates the flow amount of clean gas, according to a preferred embodiment of the present invention.
Figure 6:
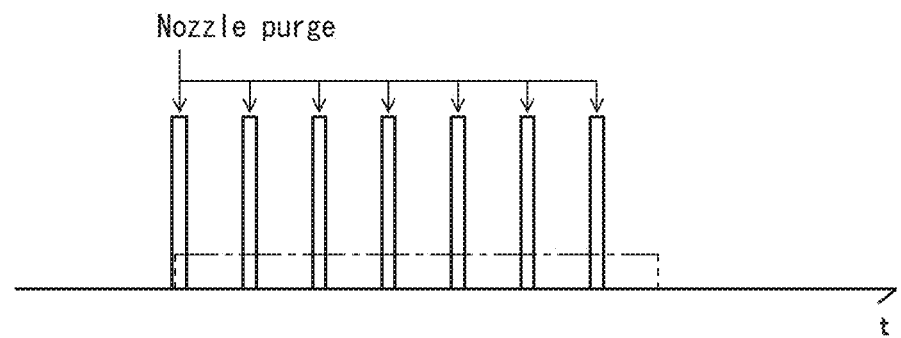
FIG. 6 is a diagram indicating the flow amount pattern of clean gas during nozzle purge (purge for cleaning a nozzle) according to a preferred embodiment of the present invention.

FIG. 5 indicates a standard purge pattern. When one shelf 14 is assigned for a next incoming FOUP 16, the purge controller 36 starts the nozzle purge for the assigned shelf 14. Preferably, the nozzle purge is carried out intermittently. In other words, clean gas is repetitively discharged as pulses for a short duration from the nozzle 20. The solid line in FIG. 6 indicates the flow amount pattern of the clean gas according to the present preferred embodiment. On the other hand, the chain line in FIG. 6 indicates a constant flow amount pattern of the clean gas for the same total flow amount. When the clean gas is discharged at a larger flow amount for shorter duration from the nozzle 20, the velocity of the clean gas is increased and the pressure around the nozzle 20 is fluctuated due to the on and off of the clean gas flow, and therefore, the nozzle is more efficiently cleaned than when the clean gas is discharged at a constant and small flow amount.

When the clean gas is discharged intermittently during the nozzle purge, the discharge duration and the discharge amount of the clean gas for one discharge pulse may be constant or not constant. For example, initially, the clean gas may be discharged for a relatively longer duration so that the nozzle 20 is cleaned and then, the clean gas may be repetitively discharged for relatively shorter duration for preventing the recontamination of the nozzle 20. Further, the flow amount of the clean gas may be changed in such a way that, initially, at a relatively larger flow amount, the nozzle purge is performed and then the nozzle purge is performed at a relatively smaller flow amount.

Figure 7:
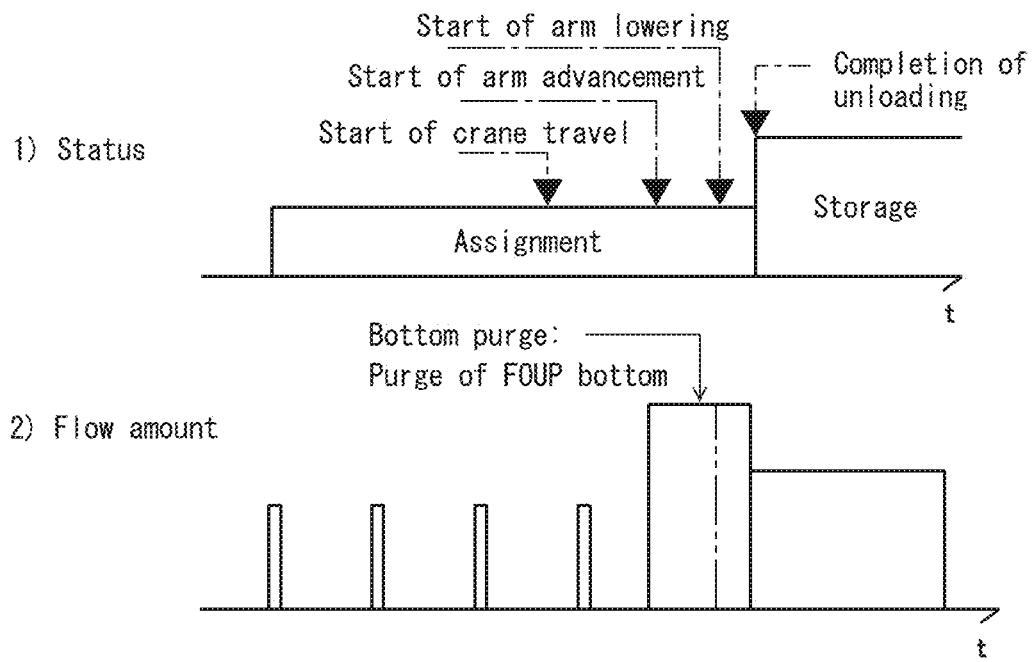
FIG. 7 is a diagram where 1) indicates the status of the arm of the transport apparatus and 2) indicates the flow amount of clean gas, according to a preferred embodiment of the present invention.
Figure 8:
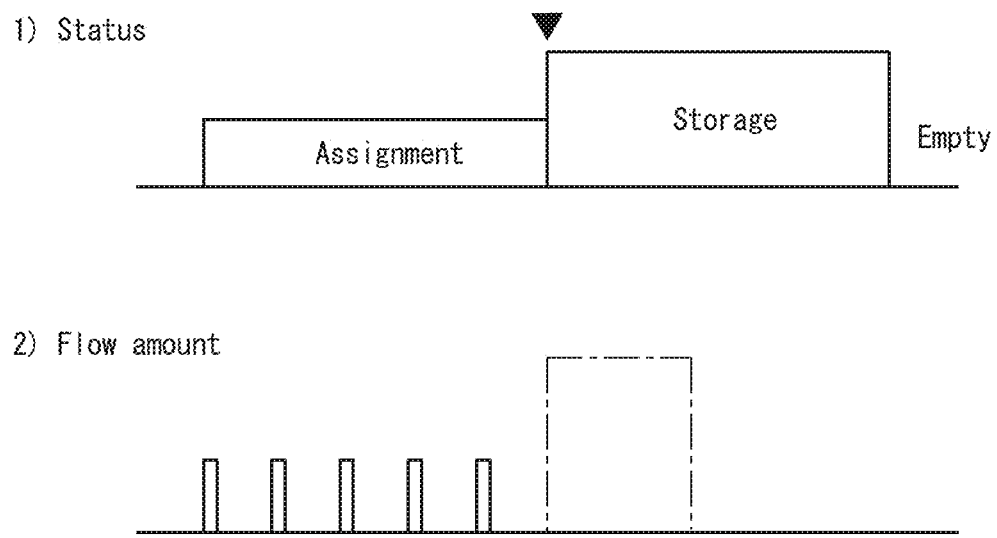
FIG. 8 is a diagram indicating the flow amount of clean gas for storage purge (purge for maintaining the cleanliness in containers) according to a preferred embodiment of the present invention, where 1) indicates the status of a shelf and 2) indicates the flow amount of clean gas.

The start of the advancement of the arm, the fork, or the like of the transfer device 10, and also the start of lowering of the arm, the fork, or the like, indicate the presence of a FOUP 16 over the shelf 14. Therefore, at the time when the arm, the fork, or the like of the transfer device 10 starts to advance, or at the time when they start to lower, clean gas is discharged, for example continuously, at a relatively larger flow amount from the nozzle 20. This makes the bottom of the FOUP 16 clean. In particular, an input valve for clean gas and its surrounding area are made clean. This process is called bottom purge, and its flow amount pattern is indicated in FIG. 7. By the way, as shown in FIG. 8, the bottom purge may be omitted. Further, during the bottom purge, the discharge of clean gas from the nozzle 20 may be made on and off so that the pulsation of clean gas flow is applied to the input valve and its neighborhood. When the load sensor 21 detects that the FOUP 16 is unloaded on the shelf 14, the purge controller 36 carries out the storage purge that replaces the atmosphere in the FOUP 16 by clean gas.

According to the present preferred embodiment, when a shelf 14 is assigned for an incoming FOUP 16 in the future, the purge controller 36 starts the purge of the nozzle 20, and therefore, the purge is carried out for a sufficiently long duration. As a result, there is no risk that a FOUP 16 is unloaded over a not fully purged nozzle nor that the unloading is postponed until the completion of the purge. Further, the intermittent nozzle purge makes the nozzle cleaner, efficiently with a small total flow amount.

Figure 9:
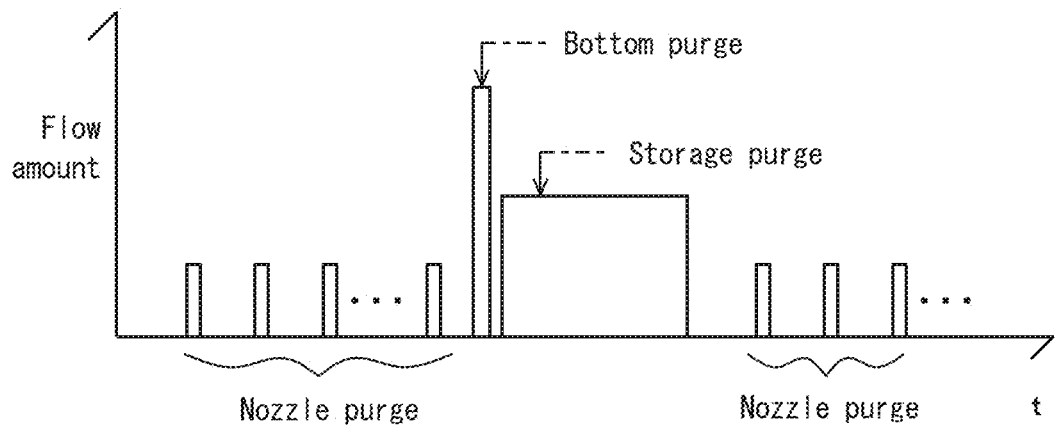
FIG. 9 is a diagram indicating the flow amount pattern of clean gas according to a modification.

FIG. 9 indicates a clean gas flow amount pattern for one group of shelves according to a modification where plural shelves 14 are controlled as one group. This modification is suitable for a case where a common MFC 22 is provided for a column or a row of shelves as a unit. When the stocker controller 30 assigns one shelf 14 within one group for a next incoming FOUP 16, the purge controller 36 starts the nozzle purge in all shelves 14 within the group. Further, when the transport apparatus 6 starts the transfer of the FOUP 16 to the assigned shelf 14 for unloading, the purge controller 36 increases the flow amount of the clean gas so that the bottom portion of the FOUP 16 is purged. When the unloading of the FOUP 16 on the shelf 14 is completed and further when the group has at least one empty shelf, the stocker controller 30 assigns the empty shelf for a next incoming FOUP 16. In addition, the storage purge is carried out for the unloaded FOUP 16 so that the atmosphere in the FOUP 16 is substituted by the clean gas. After the completion of the storage purge, the purge controller 36 restarts the nozzle purge. By the way, when there is no empty shelf within the group (when all shelves in the group are occupied), the stocker controller assigns an empty shelf within another group for the next incoming FOUP 16. Further, the purge controller 36 starts the nozzle purge in all shelves 14 within the another group.

Figure 10:
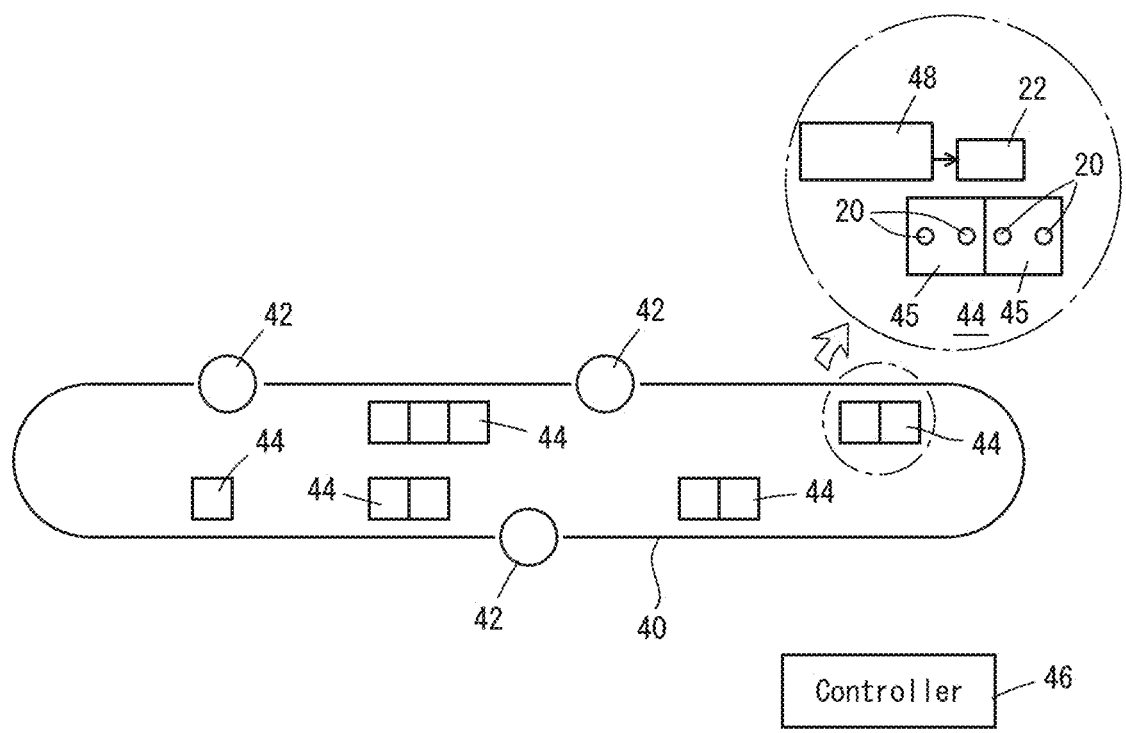
FIG. 10 is a plan view of the layout of a storage system (overhead transport system) according to a second preferred embodiment of the present invention of the present invention.

FIG. 10 indicates a preferred embodiment of the present invention where an overhead transport system is used as the storage system. Along a running rail 40, a plurality of overhead transport vehicles 42 run, and there are provided a plurality of buffers 44 that store temporarily FOUPs, along the running rail 40. By the way, the buffers 44 may include one or plural shelves 45 per buffer. Further, a system controller 46 controls the entire overhead transport system, communicates with an outside controller, and receives transport requests of FOUPs from the outside controller. In addition, the buffer 44 is provided with a nozzle 20 in each shelf 45, and a purge controller 48 controls an MFC 22 so as to regulate the supply of clean gas to the nozzle 20.

The system controller 46 assigns an empty buffer 44 to temporarily store a FOUP in advance, when it is required to transport a FOUP from an outside controller, or spontaneously without waiting for the request from the outside controller. Then, the system controller 46 instructs the purge controller 48 in the assigned empty buffer 44 to start the nozzle purge. Further, if the entrance of a transfer device of an overhead transport vehicle 42 over the shelf 45 is detectable, the purge controller 48 carries out the bottom purge.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A storage system comprising:
   a plurality of shelves each including at least one nozzle to supply clean gas into containers;
   a plurality of flow amount controllers to respectively control a supply amount of the clean gas to the at least one nozzle;
   at least one transport apparatus to transfer the containers to and from the shelves; and
   a controller to control the at least one transport apparatus and the flow amount controllers; wherein
   the controller is programmed to:
      unload an incoming container on a shelf of the plurality of shelves;
      make an assignment of at least one shelf in preparation to store a next incoming container immediately after the unloading of the incoming container is completed and before the occurrence of the next incoming container into the storage system;
      control one of the flow amount controllers to supply the clean gas to the at least one nozzle in the at least one shelf, based upon the assignment; and
      start the supply of the clean gas to the at least one nozzle at a time when the assignment is made and before the occurrence of the next incoming container into the storage system.

2. The storage system according to claim 1, wherein
   the storage system is a purge stocker and includes an entrance and dispatch port;
   the at least one transport apparatus transports the containers between the entrance and dispatch port and the shelves; and
   the controller is further configured or programmed to make the assignment of the at least one shelf in advance, before the next incoming container arrives at the entrance and dispatch port.

3. The storage system according to claim 1, wherein the controller is further programmed to control the one of the flow amount controllers to intermittently supply the clean gas to the at least one nozzle in the at least one shelf.

4. The storage system according to claim 1, wherein
   the at least one transport apparatus is provided with a transfer device entering into and unloading the next incoming container on the shelves; and
   the controller is further programmed to control the one of the flow amount controllers to supply a larger flow amount of the clean gas to the at least one nozzle, from when the transfer device starts advancement towards the at least one shelf and until completing unloading of the next incoming container, than an amount before the transfer device starts advancement.

5. A purge method in a storage system including a plurality of shelves each including at least one nozzle to supply clean gas into containers, a plurality of flow amount controllers to control a supply amount of the clean gas to the at least one nozzle, at least one transport apparatus to transfer the containers to and from the shelves, and a controller to control the at least one transport apparatus and the flow amount controllers, the method comprising:
   unloading an incoming container on a shelf of the plurality of shelves;
   making an assignment of at least one shelf in preparation to store a next incoming container immediately after the unloading of the incoming container is completed and before the occurrence of the next incoming container into the storage system, by the controller;
   supplying the clean gas to the at least one nozzle in the at least one shelf, based upon the assignment; and
   starting the supply of the clean gas to the at least one nozzle at a time when the assignment is made and before the occurrence of the next incoming container into the storage system.

6. The purge method according to claim 5, wherein the at least one transport apparatus is provided with a transfer device entering into and unloading the next incoming container on the shelves, the method further comprising:
   controlling one of the flow amount controllers to supply a larger flow amount of the clean gas to the at least one nozzle, from when the transfer device starts advancement towards the at least one shelf and until completing unloading of the next incoming container, than an amount before the transfer device starts advancement.

7. The purge method according to claim 6, further comprising:
   after the supplying the clean gas to the at least one nozzle, supplying the clean gas to a bottom portion of the next incoming container; and
   after the supplying the clean gas to the bottom portion of the incoming container, supplying the clean gas to an inside of the next incoming container.

8. The storage system according to claim 4, wherein the controller is further programmed to:
   control the one of the flow amount controllers to supply the clean gas to a bottom portion of the next incoming container after the supply of the clean gas to the at least one nozzle; and
   control the one of the flow amount controllers to supply the clean gas to an inside of the next incoming container after the supply of the clean gas to the bottom portion of the next incoming container.

* * * * *